United States Patent
Pan et al.

(10) Patent No.: US 12,456,990 B2
(45) Date of Patent: Oct. 28, 2025

(54) MEHOD FOR DEALING WITH RESPIRATORY FLOW DATA, AND COMPUTER THEREOF

(71) Applicant: RESVENT MEDICAL TECHNOLOGY CO., LTD, Shenzhen (CN)

(72) Inventors: Haiyang Pan, Shenzhen (CN); Rongrong Zhu, Shenzhen (CN)

(73) Assignee: RESVENT MEDICAL TECHNOLOGY CO., LTD, Shenzhen (CN)

( * ) Notice: Subject to any disclaimer, the term of this patent is extended or adjusted under 35 U.S.C. 154(b) by 238 days.

(21) Appl. No.: 18/477,655

(22) Filed: Sep. 29, 2023

(65) Prior Publication Data
US 2024/0223210 A1    Jul. 4, 2024

(30) Foreign Application Priority Data
Dec. 29, 2022 (CN) .......................... 202211710708.7

(51) Int. Cl.
  *H03M 7/40*  (2006.01)
  *H03M 7/30*  (2006.01)

(52) U.S. Cl.
  CPC ....... *H03M 7/4012* (2013.01); *H03M 7/6011* (2013.01); *H03M 7/70* (2013.01)

(58) Field of Classification Search
  CPC ........ H03M 7/30; H03M 7/40; H03M 7/4012; H03M 7/6011
  See application file for complete search history.

(56) References Cited

U.S. PATENT DOCUMENTS

| | | | | |
|---|---|---|---|---|
| 6,987,468 B1 * | 1/2006 | Malvar | ................... | H03M 7/00 382/245 |
| 7,701,366 B2 * | 4/2010 | Xiao | ..................... | G01S 19/258 341/51 |
| 10,937,436 B2 * | 3/2021 | Welvaadt | ............... | G10L 19/002 |
| 2004/0228252 A1 * | 11/2004 | Park | .................. | G11B 20/10046 341/155 |
| 2009/0083354 A1 * | 3/2009 | Nene | ................... | H03H 17/0227 708/320 |
| 2009/0100251 A1 * | 4/2009 | Hsu | ..................... | H03M 7/4006 712/E9.017 |

(Continued)

*Primary Examiner* — Lam T Mai
(74) *Attorney, Agent, or Firm* — Hemisphere Law, PLLC; Zhigang Ma

(57) ABSTRACT

A method for dealing with respiratory flow data includes steps of: performing integer processing on original flow data to obtain integer flow data; performing difference processing on the integer flow data to obtain difference flow data, the difference flow data having a plurality of difference values in order, the difference values having zero values, positive values, and negative values; when previous one difference value of the zero difference value or one positive difference value is negative, adding a marker value before the difference value that is zero or positive; when previous one difference value of the negative difference value is zero or positive, adding the marker value before the difference value that is negative; performing absolute value processing on the difference flow values to obtain the absolute values; and encoding the absolute values and the marker values to obtain encode flow data. A system using the method is also provided.

20 Claims, 6 Drawing Sheets

(56) References Cited

U.S. PATENT DOCUMENTS

| | | | |
|---|---|---|---|
| 2009/0251342 A1* | 10/2009 | Bacri | H03M 7/4006 |
| | | | 341/51 |
| 2010/0019965 A1* | 1/2010 | Xiao | G01S 19/258 |
| | | | 342/357.48 |
| 2010/0117875 A1* | 5/2010 | Oslick | H03M 7/46 |
| | | | 341/59 |
| 2014/0073937 A1* | 3/2014 | Rodriguez-Llorente | |
| | | | A61B 5/7246 |
| | | | 600/476 |
| 2018/0358983 A1* | 12/2018 | Kim | H03M 13/1108 |
| 2020/0046298 A1* | 2/2020 | Tsai | A61B 5/318 |

* cited by examiner

| Predetermined ranges | Delta-Delta compression value | Encode value |
|---|---|---|
| 0 | 0 | 0 |
| [-64, 64] | 9 bit ("10"+ 6bit+Flag bit) | 8 bit ("10"+6 bit) |
| [-255, 256] | 12 bit ("110"+8 bit+Flag bit) | 11 bit ("110"+8 bit) |
| [-2047, 2048] | 16bit ("1110"+11bit+Flag bit) | 15 bit ("1110"+11 bit) |
| other | 36bit ("1111"+31 bit+Flag bit) | 35 bit ("1111"+31 bit) |
| Predetermined value | -- | 8 bit("10000000") |

MEHOD FOR DEALING WITH
RESPIRATORY FLOW DATA, AND
COMPUTER THEREOF

CROSS REFERENCE TO RELATED APPLICATION

This non-provisional patent application claims priority under 35 U. S. C. § 119 from Chinese Patent Application No. 2022117107087 filed on Dec. 29, 2022, the entire content of which is incorporated herein by reference.

TECHNICAL FIELD

The disclosure relates to the field of ventilator technologies, in particular to a method for respiratory flow data, a system for respiratory flow data, and a computer.

BACKGROUND

Time series data is a very common type of data with specific rules, consisting of a collection of measured values acquired at equal time intervals, such as respiratory flow data collected by a ventilator. In recent years, with the development of medical science and technology, more and more people are aware of dangers of respiratory diseases. As a medical equipment to treat some respiratory diseases, ventilators have a wide range of applications. Therefore, as time series data, the scale of respiratory flow data presents an explosive growth trend. However, the growing respiratory flow data requires a large number of storage devices to cope with the data storage demand. Larger and more storage capacity will occupy greater system expenditure and energy resources, bringing a huge cost burden.

SUMMARY

In a first aspect, a method for dealing with respiratory flow data provided includes steps of: performing integer processing on original flow data to obtain integer flow data; performing difference processing on the integer flow data to obtain difference flow data, the difference flow data having a plurality of difference values in order, the difference values having zero values, positive values, and negative values; when previous one difference value of the zero difference value or one positive difference value is negative, adding a marker value before the difference value that is zero or positive; when previous one difference value of the negative difference value is zero or positive, adding the marker value before the difference value that is negative; performing absolute value processing on the difference flow values to obtain the absolute values; and encoding the absolute values and the marker values to obtain encode flow data.

In a second aspect, a computer equipment is provided, the computer equipment includes a memory and a processor. The a processor, configured to execute the program instructions to perform a method for dealing with respiratory flow data, the method includes steps of: performing integer processing on original flow data to obtain integer flow data; performing difference processing on the integer flow data to obtain difference flow data, the difference flow data having a plurality of difference values in order, the difference values having zero values, positive values, and negative values; when previous one difference value of the zero difference value or one positive difference value is negative, adding a marker value before the difference value that is zero or positive; when previous one difference value of the negative difference value is zero or positive, adding the marker value before the difference value that is negative; performing absolute value processing on the difference flow values to obtain the absolute values; and encoding the absolute values and the marker values to obtain encode flow data.

As described above, first, the original flow data is integer processed to obtain integer flow data, the first two integer values of the integer flow data are kept unchanged, and the other integer values are differentially calculated to obtain difference data, the first two integer values and the difference data form the difference flow data. According to the periodic characteristic and monotonic characteristic of the respiratory flow data, that is, the marker value of the difference value changes periodically, so that the marker value indicates the flat bit change of the adjacent difference values, the flag bit of the subsequent difference value with the same flag can be removed, thus reducing the flag bit of the stored data. Finally, the difference flow data is compressed to obtain the encoded flow data, and the compression of original flow data are completed with higher compression efficiency.

BRIEF DESCRIPTION OF THE DRAWINGS

In order to more clearly explain the technical scheme in the embodiments of the present application or the prior art, the following is a brief introduction of the drawings required to be used in the description of the embodiments or the prior art. Obviously, the drawings described below are only some embodiments of the present application. Other drawings can also be obtained based on the structures shown in these drawings.

The realization, functional features and advantages of this application will be combined with embodiment, and refer to the attached figures for further explanation.

DETAILED DESCRIPTION OF THE EMBODIMENTS

The technical scheme of the disclosure will be clearly and completely described below in combination with the accompanying drawings. Obviously, the described embodiments are part of the embodiments of the disclosure, not all of them. Based on the embodiments of the disclosure, all other embodiments obtained by those skilled in the art without creative work belong to the protection scope of the disclosure.

The terms "first", "second", "third", "fourth", when any, in the specification, claims and drawings of this application are configured to distinguish similar objects but need not be configured to describe any particular order or sequence of priorities. It should be understood that the data used here are interchangeable where appropriate, in other words, the embodiments described can be implemented in order other than what is illustrated or described here. In addition, the terms "include" and "have" and any variation of them, can encompass other things. For example, processes, methods, systems, products, or equipment that comprise a series of steps or units need not be limited to those clearly listed, but may include other steps or units that are not clearly listed or are inherent to these processes, methods, systems, products, or equipment.

It is to be noted that the references to "first", "second", etc. in the disclosure are for descriptive purpose only and neither be construed or implied the relative importance nor indicated as implying the number of technical features. Thus, feature defined as "first" or "second" can explicitly or implicitly include one or more such features. In addition, technical solutions between embodiments may be integrated, but only on the basis that they can be implemented by ordinary technicians in this field. When the combination of technical solutions is contradictory or impossible to be realized, such combination of technical solutions shall be deemed to be non-existent and not within the scope of protection required by the disclosure.

Figure 1:
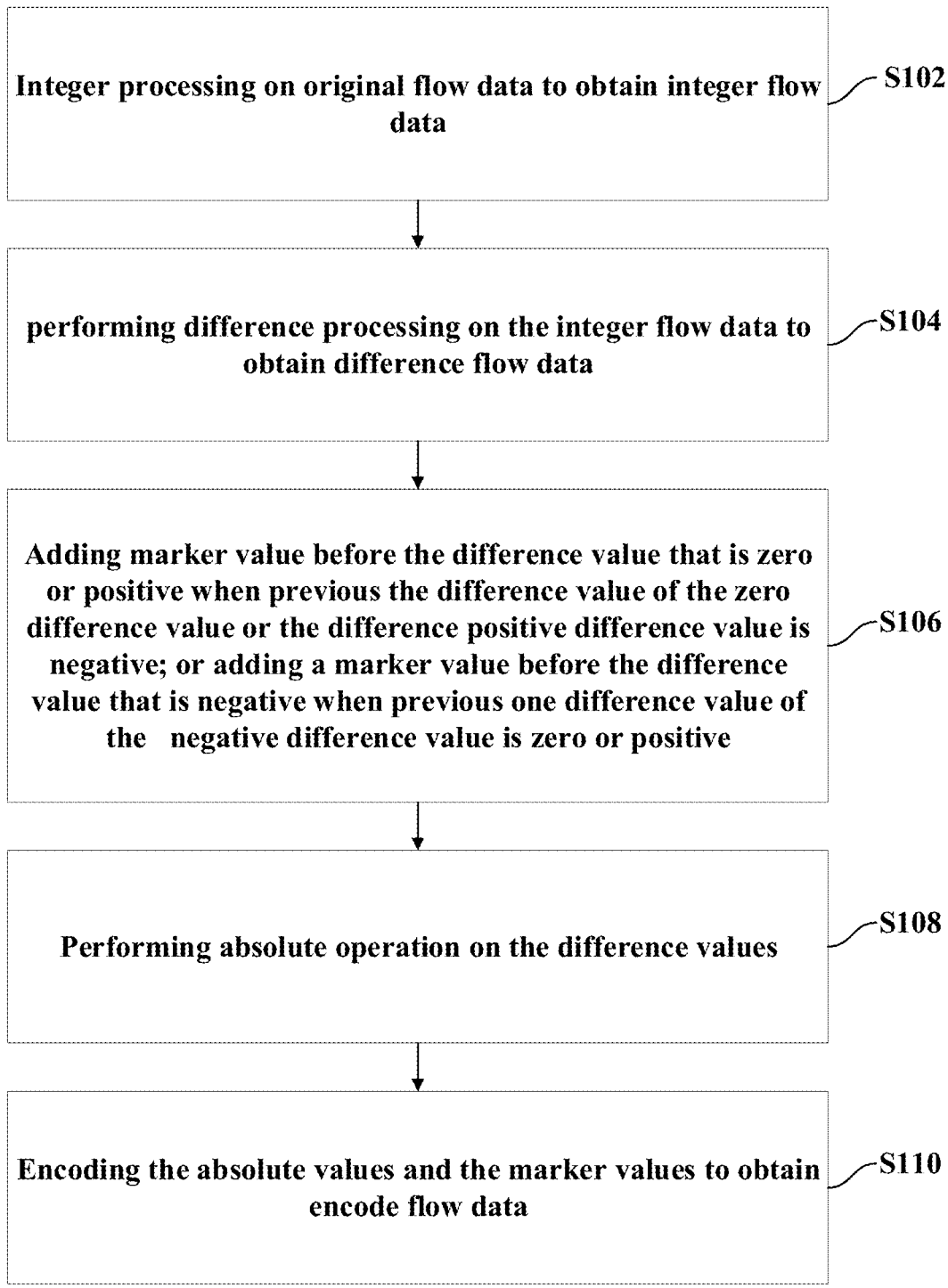
FIG. 1 illustrates a diagram of a method for dealing with respiratory flow data in accordance with an embodiment.
Figure 7:
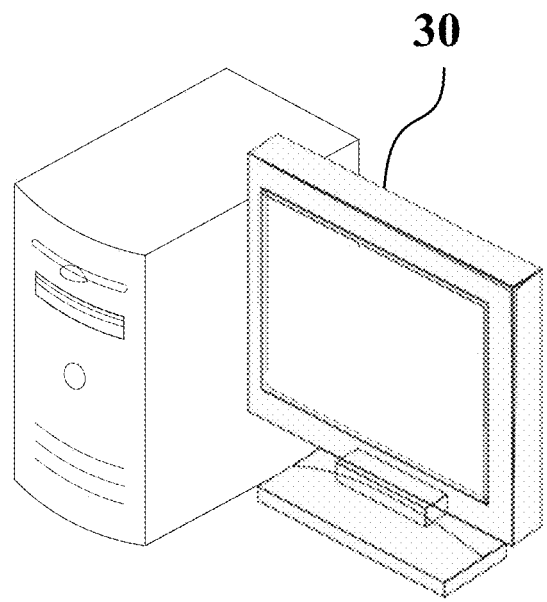
FIG. 7 illustrates an application scene diagram of the method for dealing with the respiratory flow data in accordance with an embodiment.

Referring to FIG. 1 and FIG. 7, FIG. 1 illustrates a diagram of a method for dealing with the respiratory flow data in accordance with an embodiment. FIG. 7 illustrates a scene diagram of the method for dealing with the respiratory flow data in accordance with an embodiment. The method for dealing with the respiratory flow data is applied to ventilator and other ventilation therapy apparatus to dealing the respiratory flow data generated by the ventilation therapy apparatus, so as to compress the respiratory flow data.

Taking the scene of the method for dealing with the respiratory flow data shown in FIG. 7 as an example, a processing platform 30 is used to execute the method for dealing with the respiratory flow data. In this embodiment, the processing platform 30 is electrically connected or in communication with the ventilation therapy apparatus. Related functions of the processing platform 30 can be but not limited to be realized by one device, or by more than one devices, or by one or more functional modules in one device. It is understood that, the above functions module can be either network elements in a hardware device, or software capabilities running on dedicated hardware, or the combination of hardware and software, or virtualization function instantiated on a platform (for example, a cloud platform).

The method for dealing with the respiratory flow data includes the following steps.

At step S102, original flow data is integer processed to obtain integer flow data.

Figure 8:
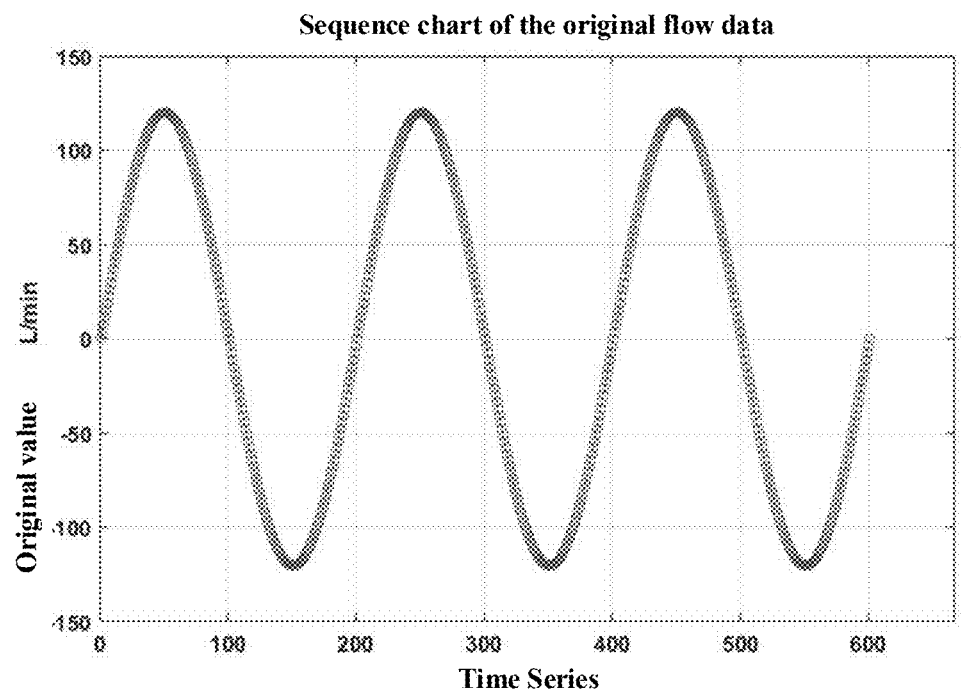
FIG. 8 is a sequence chart of the original flow data shown in FIG. 1.

The processing platform 30 receives original flow data from the ventilation therapy device. The original flow data is sequential data with periodic and monotonic characteristics, as shown in FIG. 8. In this embodiment, the original respiratory flow data includes a plurality of original values arranged in order, in other words, the original values are arranged in chronological order that the original flow data are formed.

In detail, after receiving the original flow data from the ventilation therapy equipment, the processing platform 30 rounds the original flow data to obtain integer flow data. The integer flow data includes a plurality of integer values. Accordingly, the plurality of the integer values are arranged in order. Further more, the plurality of the integer values are arranged in chronological order.

How to round the original flow data to obtain integer traffic data is described in detail below.

At step S104, difference flow data is obtained by performing difference processing on the integer flow data.

The processing platform 30 performs difference processing on the integer flow data to obtain difference flow data. In detail, the difference flow data includes a plurality of difference values, the difference values are arranged in order, further more, the plurality of the difference values are arranged in chronological order. the difference values include zero values, positive values, negative values. The difference values has minus and plus. Storing data requires a flat bit to distinguish between the positive and negative values. In detail, the flat bit can be stored a positive sign or a negative sign. The positive sign indicates the positive value, and the negative sign indicates the negative value.

The step S104 includes that: the processing platform 30 performs second-order difference processing on the integer values to obtain difference flow values. In particular, the processing platform 30 calculates the difference value beginning a third integer value of the integer flow data. In detail, the processing platform 30 reserves first two integer value of the integer flow data which refers as first two values of the difference flow values; the processing platform 30 performs second-order difference processing on the other integer values of the integer flow data to obtain the other values of the difference flow values accordingly. That is, the first two values of the difference flow values are the first two values of the integer flow data, and the other value of the difference flow values are the second-order difference values obtained by performing second-order difference processing on the integer values beginning the third predetermined value of the integer flow data.

In this embodiment, the processing platform 30 calculates the difference value according to a difference calculation formula. Specifically, the difference calculation formula is: $D=(t_n-t_{n-1})-(t_{n-1}-t_{n-2})$. Wherein, D indicates the difference value, and $t_{n-2}$, $t_{n-1}$, and $t_n$ indicate three continuous of the integer values in chronological order.

Figures 9, 10:
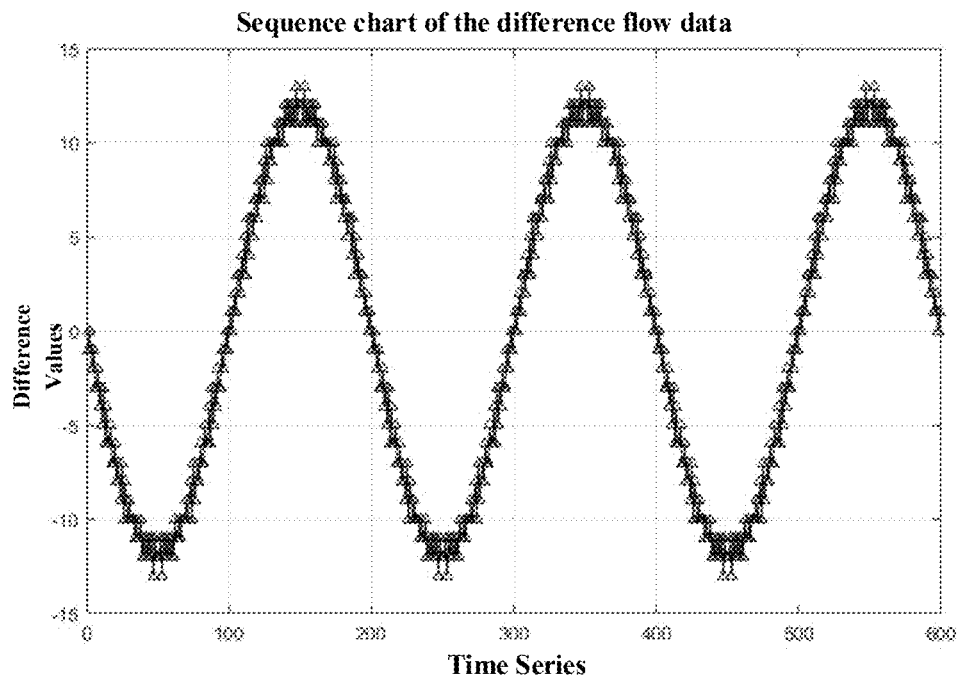
FIG. 9 is a sequence chart of the difference flow data shown in FIG. 1.
FIG. 10 is a bit table of the coded data shown in FIG. 6.

Since the original flow data has periodic and monotonicity, the difference flow data obtained by processing the original flow data has corresponding periodic and monotonicity characteristic. As shown in FIG. 9, a part of the difference values with negative values are continuous in chronological order, the other part of the difference values with positive values are continuous in chronological order, and the continuous negative values and the continuous positive values are arranged alternately.

At step S106, when previous one difference value of the zero difference value or one positive difference value is negative, a marker value is added before the difference value that is zero or positive; or when previous one difference value of the negative difference value is zero or positive, a marker value is added before the difference value that is negative.

The processing platform 30 judges the continuity of the difference values. When a previous one difference value of the positive difference value or zero is negative, the processing platform 30 adds a marker value before the positive difference value or zero, that is, the processing platform 30 adds a marker value after the negative difference value. When the previous one difference value of the negative difference value is positive or zero, the processing platform 30 adds a marker value before the negative difference value, that is, the processing platform 30 adds a marker value after positive or zero.

At step S108, absolute values of the difference values are obtained by performing absolute operation on the difference values.

The processing platform 30 performs absolute operation on all difference values to obtain the absolute values. In this embodiment, the processing platform 30 removes the negative sign of the negative difference values, thus subtracting a flat bit from the negative value to obtain the absolute value of the negative difference values. It is understood that, the difference flow data obtained includes zero and absolute values. That is to say, all the values in the difference flow data obtained are non-negative numbers, and all the values do not include sign.

At step S110, the absolute values and the marker values are encoded to obtain encode flow data.

The processing platform 30 encodes the marker values and the absolute values to obtain the coded flow data. Accordingly, the encode flow data includes a plurality of code values arranged in sequence, in detail, the plurality of code values are arranged in chronological order. In this embodiment, the processing platform 30 encodes the marker value and absolute value according to a compression coding method named Delta-Delta to obtain the code values that forming the encode flow data.

The processing platform stores the encode flow data into a corresponding database.

How to encode the marker values and the absolute values to obtain the encode flow data will described in detail below.

In the above embodiments, first, performing integer processing on the original flow data to obtain integer flow data, the first two values of the integer flow data are not processed, and the value of the integer flow data beginning the third predetermined value are performed second-order difference processing to form the difference flow data. According to the periodic and monotone characteristic of the original flow data, that is, the signs of difference values changes periodically. when the maker value represents the sign change of adjacent difference values, then the subsequent difference values with the same sign can be ignored, thus reducing the flat bit required for data storage. Finally, utilizing the compression coding method named Delta-Delta to encode the difference flow data to obtain encode flow data, so as to complete the compression of the original flow data and obtain the encode flow data with higher compression efficiency.

Since the signs of the continuous positive values or that of the continuous negative value are the same, when the difference value changes from the positive value to the negative value, or from the negative value to the positive value, or from the negative value to zero, or from zero to the negative value, the marker value can replace the positive signs of the continuous positive values or the negative signs of the continuous negative values. Furthermore, the data of the flat bit of the subsequent difference values can be canceled, so that the positive and negative values that need a flat bit both reduce one flat bit, thus reducing the storage bit and making, all the values that need to be encoded, be zero or positive. By processing the flat bit of the absolute flow data and cooperating with encoding compression named Delta-Delta, it can obtain higher data compression rate and be suitable for periodic monotonic data.

Figure 2:
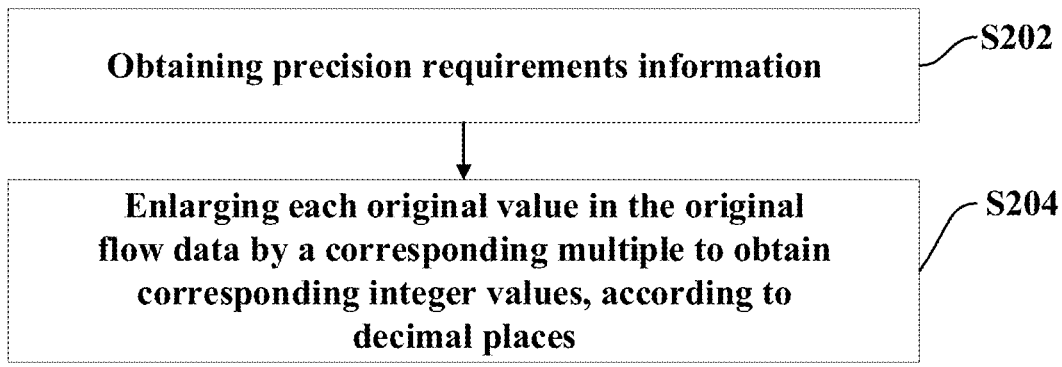
FIG. 2 illustrates a first sub-flow schematic diagram of the method for dealing with the respiratory flow data in accordance with an embodiment.

Referring to FIG. 2, FIG. 2 illustrates the first sub-flow diagram of the method for dealing with original flow data in an embodiment. The step S102 includes the following steps S202-S204.

At the step S202, precision requirements information is obtained.

The processing platform 30 obtains precision requirements information. In this embodiment, the precision requirement information includes one or more decimal places. The number of the decimal places indicate the number of digits after the decimal point to be retained for an original value. For example, when the number of decimal digits is 1, the original value can retain 1 valid decimal place. when the number of decimal digits is 2, the original value can retain 2 valid decimal places. The specific number of decimal places can be set according to an actual demand, but can not be limited.

At the step S204, each original value in the original flow data is enlarged by a corresponding multiple to obtain corresponding integer values, according to decimal places.

The processing platform 30 expands each original value by a corresponding multiple according to the number of decimal digits and rounds the each original value to obtain the corresponding integer value. In this embodiment, the expansion is multiplied by ten to the Nth power. Where the value of n is equal to the number of decimal digits. For example, when the number of decimal digits is 1, expand the original value by 10 times and round the expansion original value; when the number of decimal digits is 2, expand the original value by 100 times and round the expansion original value.

In the above embodiments, the original flow data to be compressed is integer according to the precision requirements to generate integer flow data for the convenience of subsequent processing.

Figure 3:
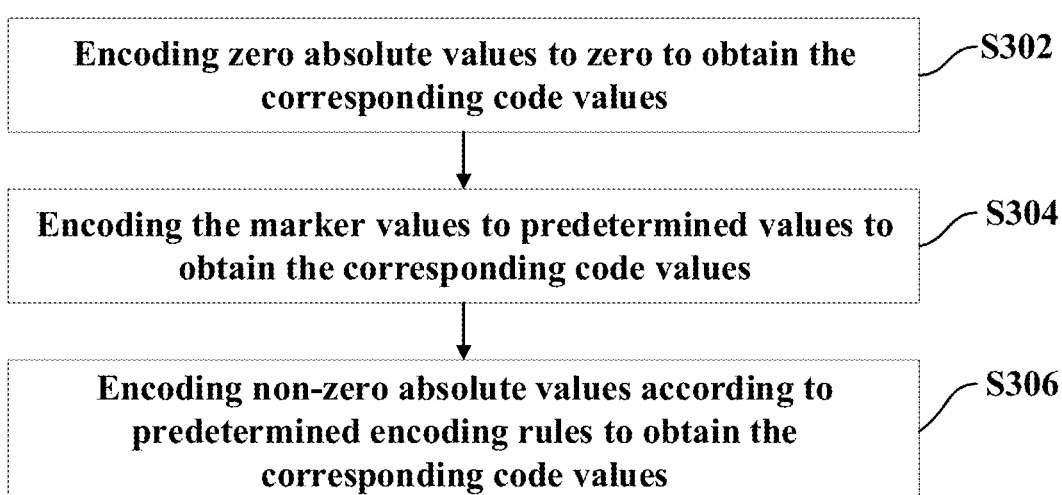
FIG. 3 illustrates the second sub-flow schematic diagram of the method for dealing with the respiratory flow data in accordance with an embodiment.
Figure 4:
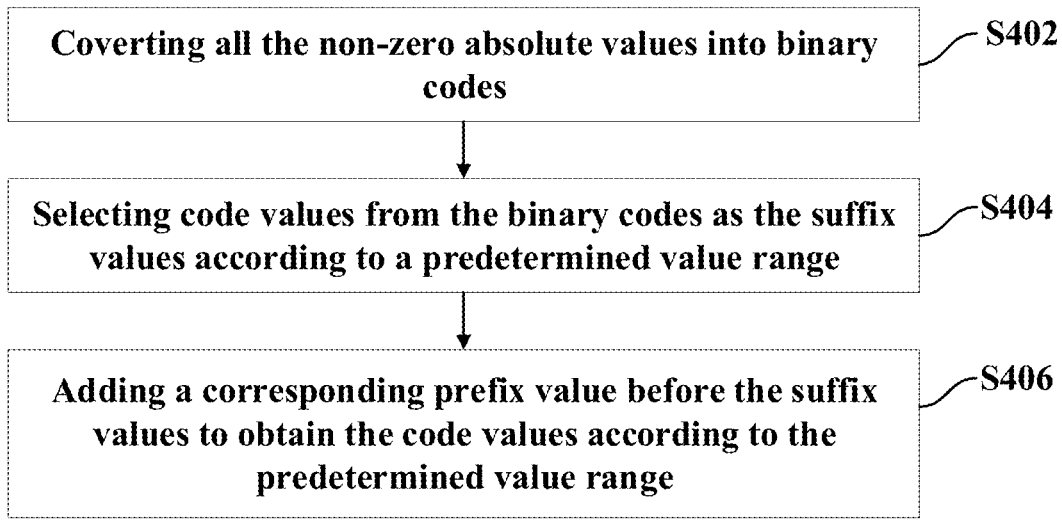
FIG. 4 illustrates the third sub-flow schematic diagram of the method for dealing with the respiratory flow data in accordance with an embodiment.

Referring to FIGS. 3-4, FIG. 3 illustrates the second sub-flow schematic diagram of the method for dealing with the respiratory flow data in accordance with an embodiment. FIG. 4 illustrates a third sub-flow schematic diagram of the method for dealing with the respiratory flow data in accordance with an embodiment. The step S110 includes following steps S302-S306.

At the step S302, zero absolute values are encoded to zero, that corresponding code values for the zero absolute values are obtained.

The processing platform 30 sets the encode value for the absolute values of zero, to zero.

At the step S304, the marker values are encoded to predetermined values, that corresponding encoded data for the marker values is obtained.

The processing platform 30 set the code values corresponding to the marker values to the predetermined values. In this embodiment, the predetermined is 10000000. In some other embodiments, the predetermined values can be set according to an actual situation but cannot be limited.

At the step S306, non-zero absolute values are encoded according to predetermined encoding rules that corresponding code values for the non-zero absolute values are obtained.

The processing platform 30 encodes non-zero absolute values to obtain corresponding coded values according to the predetermined encoding rules. In this embodiment, each coded value includes a prefix value and a suffix value, and the prefix value and the suffix value are combined together to form the code values. The details are described as follows.

At the step S402, all the non-zero absolute values are converted to binary codes.

The processing platform 30 converts all the non-zero absolute values to the binary codes. For example, when one absolute value is 8, the corresponding binary codes is 0001000.

At the step S404, the binary codes are selected as the suffix values according to a predetermined value range.

The processing platform 30 selects code values from the binary codes as the suffix values according to the predetermined value range. In this embodiment, the predetermined value ranges includes the values from 1 to 63, the values from 64 to 255, the value from 256 to 2047, and others.

How to select the code values from the binary codes as the suffix values according to the predetermined value range will be described in detail below.

At step S406, a corresponding prefix value is added before the suffix values to obtain the code values according to the predetermined value range.

The processing platform 30 adds one corresponding prefix value before each suffix values to obtain the coding value according to the predetermined value range.

How to add one corresponding prefix value before each the suffix value to obtain the code values according to the predetermined value range is described in detail below.

Figure 5:
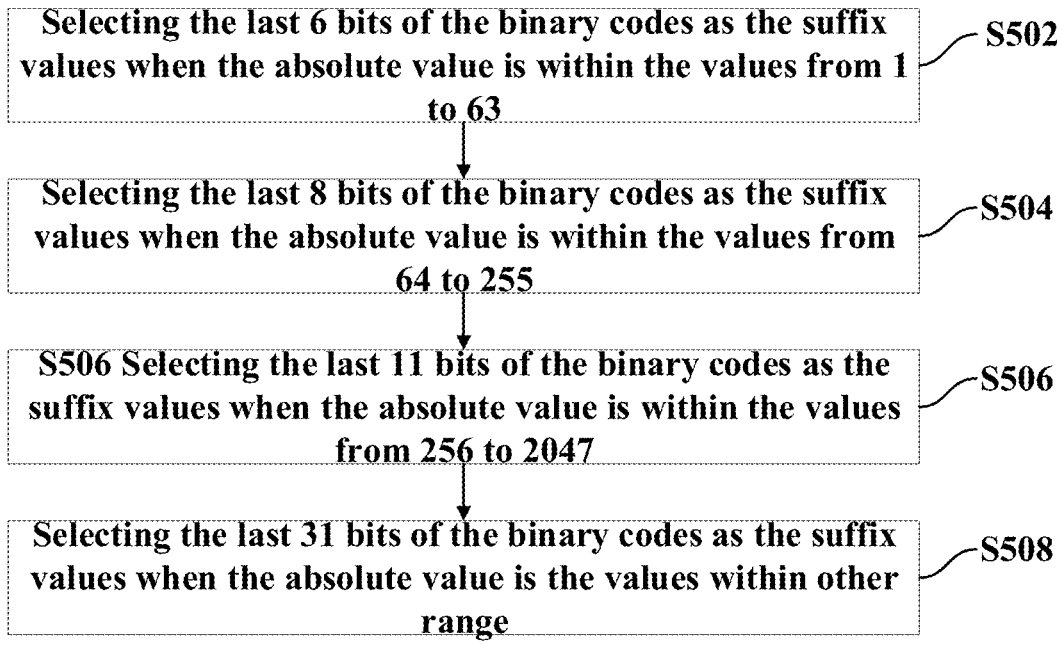
FIG. 5 illustrates the fourth sub-flow schematic diagram of the method for dealing with the respiratory flow data in accordance with an embodiment.

Referring to FIG. 5, FIG. 5 illustrates a fourth sub-flow schematic diagram of the method for dealing with the respiratory flow data in an embodiment. The processing platform 30 matches each absolute value to a predetermined value range. The step S404 includes following steps.

At step S502, the last 6 bits of the binary codes are selected as the suffix values when the absolute value is within the values from 1 to 63.

The processing platform 30 selects the last six bits of the binary codes as the suffix value when the absolute value is between 1 and 63. It is understood that, the values of the binary codes of 6-bits can just locates within the values from 1 to 63. Therefore, only the last 6-bits binary codes can be selected as suffix values. For example, when the binary codes of the absolute value 8 is 0001000, the corresponding suffix value is 001000.

At step S504, the last 8 bits of the binary codes are selected as the suffix values when the absolute value is within the values from 64 to 255.

The processing platform 30 selects the last 8 bits of the binary codes as the suffix value when the absolute value is between 64 and 255. It is understood that, the values of the binary codes of 8 bits can be just locates within the values from 64 to 255. Therefore, only the last 8 bit of the binary codes are selected as the suffix value.

At step S506, the last 11 bits of the binary codes are selected as the suffix values when the absolute value is within the values from 256 to 2047.

The processing platform 30 selects the last 11 bits of the binary codes as the suffix value when the absolute value is between 256 and 2047. It is understood that, the values of binary codes of 11-bit can just located within values from 256 to 2047. Therefore, only the last 11 bit code can be selected as the suffix value.

At step S508, the last 31 bits of the binary codes are select as the suffix values when the absolute value is the values within other range.

The processing platform 30 selects the last 31 bits of the binary codes as the suffix value when the absolute value is the values within other range. It is understood that, the binary codes of 31 bit can located just after the value 2048. Therefore, only the last 31 bits binary codes can be selected as the suffix value. In some embodiments, The processing platform 30 may also select the last m bit binary codes from the binary codes as the suffix value. The value of m is larger than 11. The value of m can be set based on an actual situation.

Figure 6:
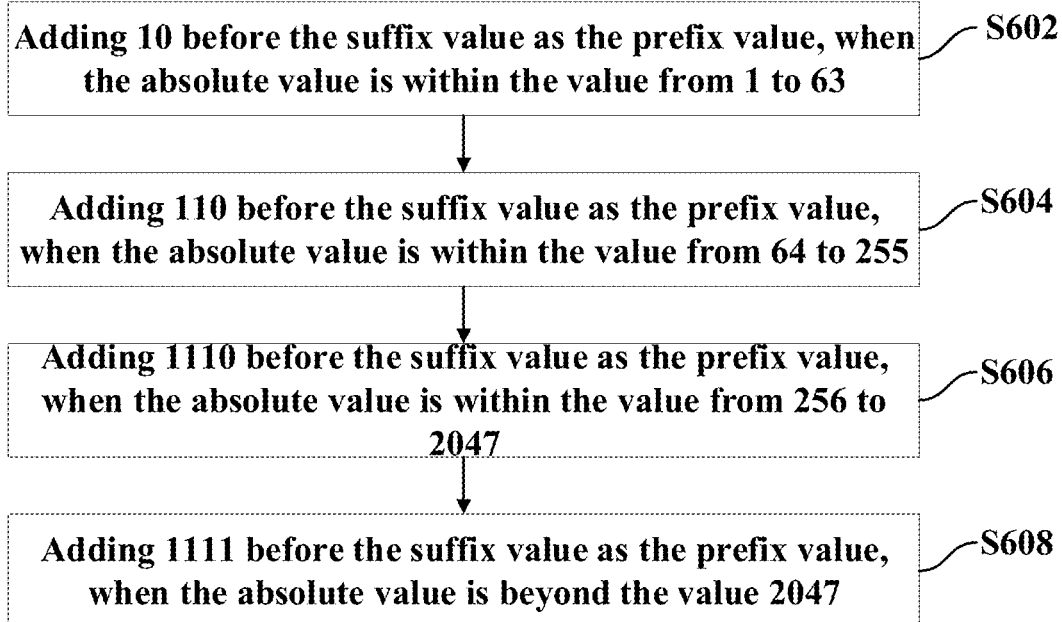
FIG. 6 illustrates the fifth sub-flow schematic diagram of the method for dealing with the respiratory flow data in accordance with an embodiment.

Referring to FIG. 6, FIG. 6 illustrates a fifth sub-flow schematic diagram of the method for dealing with the respiratory flow data in an embodiment. The step S406 includes following steps.

At step S602, 10 is added before the suffix value, as the prefix value, when the absolute value is within the value from 1 to 63.

The processing platform 30 adds 10 before the suffix value as the prefix value when the absolute value is between 1 and 63 For example, when the suffix of the absolute value 8 is 001000, the corresponding code value is 10001000.

At step S604, 110 is added before the suffix value as the prefix value, when the absolute value is within the value from 64 to 255.

The processing platform 30 adds 110 before the suffix value as the prefix value when the absolute value is within the value from 64 to 255.

At step S606, 1110 is added before the suffix value as the prefix value when the absolute value is within from 256 to 2047.

The processing platform 30 adds 1110 before the suffix value, as the prefix value, when the absolute value is within from 256 to 2047.

At step S608, 1111 is added before the suffix value, as the prefix value, when the absolute value is within other range, the other range beyond 2047.

The processing platform 30 adds 1111 before the suffix value, as the prefix value, when the absolute value is between other range.

In different predetermined value ranges, the bits number of the code values, processed by the method for dealing with the respiratory flow data, compared with the bits number of the compressed values, compressed by the encoding compression named Delta-Delta, is shown in FIG. 10. when the predetermined value range is the same, the compressed value has one more bits than the code values. It is understood that, compared with the compression of the original flow data directly by encoding compression named Delta-Delta, and inserting marker values into difference flow data to distinguish the continuity of the positive and the negative values, so that it does not need to record flat bits in the code values, thus all code values decrease by one bit.

In some embodiments, the specific value of the prefix value corresponding to each preset range can be set according to the actual situation. In the above embodiments, firstly converting all the values that need to be encoded into binary codes that are easy to store, then the corresponding binary codes is processed according to the predetermined value range to obtain the coded value.

Figure 11:
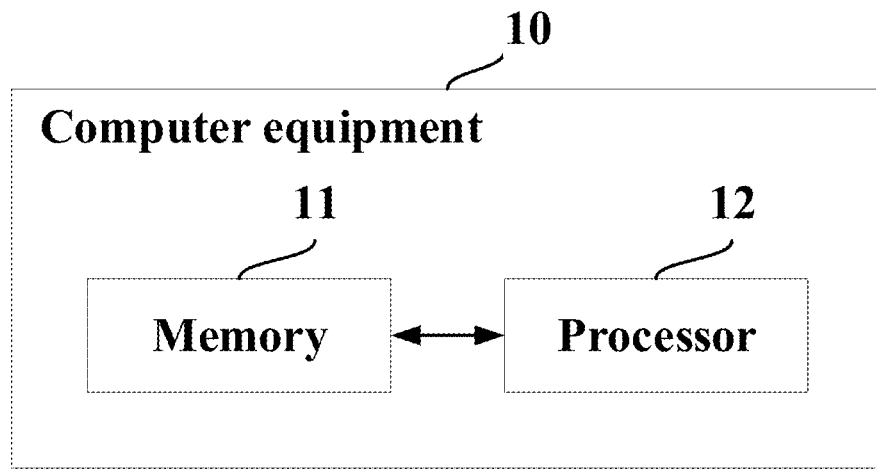
FIG. 11 is a schematic diagram of an internal structure of a computer equipment.

Referring to FIG. 11, FIG. 11 illustrates a schematic diagram of an internal structure of the computer equipment in an embodiment. The computer equipment 10 includes a memory 11, and a processor 12. The memory 11 is configured to store program instructions, and processor 12 is configured to execute the program instructions to implement the above method for dealing with the respiratory flow data.

In some embodiments, the processor 12 may be a Central Processing Unit (CPU), controller, microcontroller, microprocessor, or other data processing chip used to run program instructions stored in memory 11.

The memory 11 includes at least one type of readable storage medium, which includes flash memory, hard disk, multimedia card, card type memory (for example, SD or DX memory, etc.), magnetic memory, disk, optical disc, etc. Memory 11 in some embodiments may be the internal storage unit of a computer device, such as the hard disk of a computer device. Memory 11 can also be an external storage device of a computer device in other embodiments, such as a plug-in hard disk, Smart Media Card (SMC), Secure Digital (SD) Card, Flash Card, etc., equipped with a computer device. Further, memory 11 can include both the internal storage units of computer devices and external storage devices. Memory 11 can not only be used to store application software installed in computer equipment and various types of data, such as the implementation of respiratory flow data processing method code, but also can be used to temporarily store the output or to output data.

Figure 12:
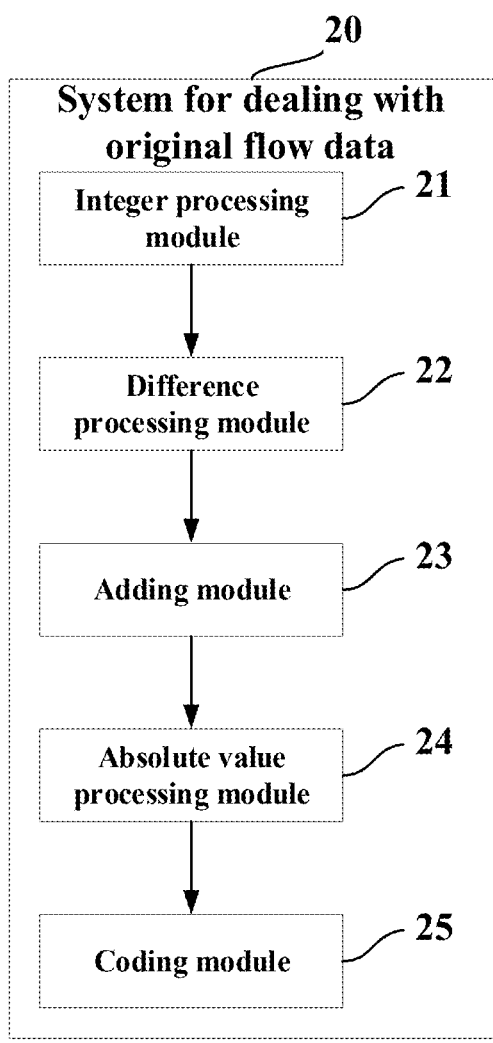
FIG. 12 is a function block diagram of a system for dealing with respiratory flow data.

Referring to FIG. 12, FIG. 12 illustrates a schematic diagram of program modules of a system for dealing with the respiratory flow data.

The system 20 is applied to ventilator and other ventilation therapy equipment, and configured to process respiratory flow data generated by ventilation therapy equipment to compress respiratory flow data. The system 20 includes an integer processing module 21, a difference processing module 22, an adding module 23, an absolute value processing module 24, and a coding module 25.

The integer processing module 21 is configured to round the original flow data to obtain integer data.

In detail, the integer processing module 21 receives the original flow data from the ventilation therapy device. The original flow data is sequential data with periodic monotonic characteristics, as shown in FIG. 8. In this embodiment, the original flow data includes a plurality original values in order, the original values are arranged in chronological order to form the original flow data.

After receiving the original flow data from the ventilation therapy equipment, the integer processing module 21 integers the original flow data to obtain integer flow data. The integer flow data includes a plurality of integer values. Accordingly, the plurality of the integer values are arranged in order, that is, the plurality of the integer values are arranged in chronological order.

The difference processing module 22 is configured to perform difference processing on the integer data to obtain difference data.

The difference processing module 22 performs difference processing on the integer data to obtain difference data The difference data includes a plurality of difference values in order, the plurality of the difference values include zero, positive values, and negative values. Accordingly, the plurality of the difference values are arranged in order, that is, the plurality of the difference values are arranged in chronological order. In this embodiment, the plurality of the difference values include zero, positive values, and negative values. Since the difference values have positive signs and negative signs, and when the difference values are stored, there needs one-bit for storing a sign to distinguish the positive value or negative value.

Performing difference processing on integer data to obtain difference data specifically include: the difference processing module 22 calculates second-order difference of the integer values to obtain difference values. In particular, the difference processing module 22 computes the difference values from the third integer value of the integer flow data. Specifically, the difference processing module 22 takes the first two integer values of integer data as the first two difference values. and takes the third integer value and subsequent integer value with the second-order difference value as the third difference values and subsequent difference values, so as to obtain the difference value. That is, it does not process the first two integer values of integer data, and calculates the corresponding difference values from the third integer value, thus forming difference flow data.

In this embodiment, the difference processing module 22 calculates the difference value according to a difference formula. Specifically, the difference calculation formula is: $D=(t_n-t_{n-1})-(t_{n-1}-t_{n-2})$. D indicates the difference value, and $t_{n-2}$, $t_{n-1}$, and $t_n$ indicate three continuous integer values in chronological order.

Since the original flow data has periodic and monotonicity characteristics, the difference flow data obtained also has periodic and monotonicity characteristics. As shown in FIG. 9, a part of the difference values with the negative values are continuous in chronological order, a part of the difference values with the positive values are continuous in chronological order, the negative values, and positive values are arranged alternately.

The adding module 23 is configures to judge continuity of the difference values. When previous one difference value of the positive difference value or zero is negative, the adding module 23 adds a marker value before the positive difference value or zero. When previous one difference value of the negative difference value is negative, the adding module 23 adds a marker value before the positive difference value or zero.

In detail, the module 23 judges the continuity of difference values. When the previous one difference value of the positive difference value or the zero difference value is negative, the module 23 adds a marker before the positive difference value or zero, that is, the module 23 adds a marker after the negative difference value. When the previous one difference value of the negative difference value is positive or zero, the module 23 adds a marker before the negative difference value, that is, the module 23 adds a marker after the positive difference value or zero difference value.

The absolute value processing module 24 is configured to perform absolute value process on the difference values to obtain the absolute values.

In detail, the absolute value processing module 24 performs absolute value processing on all difference values to obtain absolute values. In this embodiment, The absolute value processing module 24 removes the negative sign of the negative difference values, thus subtracting a flat bit from the negative value to obtain the absolute value of the negative difference values. It is understood that, the difference flow data obtained includes zero and absolute values. That is to say, all the values in the difference flow data obtained are non-negative numbers, and all the values do not include flat bit.

The coding module 25 is configured encode the absolute values and the marker values to obtain encoded flow data.

In detail, the coding module 25 encodes the marker value and the absolute value to obtain the encoded flow data. Accordingly, the plurality of the code values are arranged in sequence, that is, the plurality of the code values are arranged in chronological order. In this embodiment, the coding module 25 encodes the marker value and absolute value according to the method of encoding compression named Delta-Delta to obtain the corresponding encoding value, thus forming the encoded flow data.

The above are only the preferred embodiments of this disclosure and do not therefore limit the patent scope of this disclosure. And equivalent structure or equivalent process transformation made by the specification and the drawings of this disclosure, either directly or indirectly applied in other related technical fields, shall be similarly included in the patent protection scope of this disclosure.

It should be noted that the embodiments number of this disclosure above is for description only and do not represent the advantages or disadvantages of embodiments. And in this disclosure, the term "including", "include" or any other variants is intended to cover a non-exclusive contain. So that the process, the devices, the items, or the methods includes a series of elements not only include those elements, but also include other elements not clearly listed, or also include the inherent elements of this process, devices, items, or methods. In the absence of further limitations, the elements limited by the sentence "including a . . . " do not preclude the existence of other similar elements in the process, devices, items, or methods that include the elements.

The above disclosed preferred embodiments of the invention are intended only to assist in the elaboration of the invention. The preferred embodiment does not elaborate on all the details and does not limit the invention to a specific embodiment. Obviously, according to the contents of this instruction manual, a lot of amendments and changes can be made. These embodiments are selected and described in detail in this specification for the purpose of better explaining the principle and practical application of the invention, so that the technical personnel in the technical field can better understand and utilize the invention. The invention is limited only by the claims and their full scope and equivalents.

The invention claimed is:

1. A method for dealing with respiratory flow data, the method comprises:
    performing integer processing on original flow data to obtain integer flow data;
    performing difference processing on the integer flow data to obtain difference flow data, the difference flow data having a plurality of difference values in order, the difference values having zero values, positive values, and negative values;
    if previous one difference value of the zero difference value or one positive difference value is negative, adding a marker value before the difference value that is zero or positive; when previous one difference value of the negative difference value is zero or positive, adding the marker value before the difference value that is negative;
    performing absolute value processing on the difference flow values to obtain the absolute values; and
    encoding the absolute values and the marker values to obtain encode flow data.

2. The method according to claim 1, wherein encoding the absolute values and the marker values to obtain encode flow data comprises:
    setting value of code data for each zero absolute value to zero;
    setting value of code data for each marker value to a predetermined value; and
    encoding non-zero absolute values to obtain the corresponding coding data according to a predetermined encoding rules.

3. The method according to claim 2, wherein encoding non-zero absolute values to obtain the corresponding coding data according to a predetermined encoding rules comprises:
    converting each non-zero absolute value to binary codes;
    selecting code values from the binary codes as suffix values according to predetermined value ranges; and
    adding a corresponding predetermined prefix value before the suffix values to obtain the corresponding coding data of the non-zero absolute value according to the predetermined value ranges.

4. The method according to claim 3, wherein the predetermined value ranges includes a first predetermined value range, a second predetermined value range, a third predetermined value range, and a fourth predetermined value range, selecting the code values from the binary codes as the suffix values according to the predetermined value ranges comprises:
    when the absolute value is within the first predetermined value range, selecting the last N bits of the binary codes as the suffix values, N bits of the binary codes can indicate all values contained in the first predetermined value range;
    when the absolute value is within a second predetermined value range, select the last M bits of the binary codes as the suffix values, M bits of the binary codes can indicate all values contained in the second predetermined value range, M is larger than the N;
    when the absolute value is within the third predetermined value range, selecting the last O bits of the binary codes as the suffix values, O bits of the binary codes can indicate all values contained in the third predetermined value range, O is larger than M; and
    when the absolute value is within the fourth predetermined value range, selecting the last P bits of the binary codes as the suffix values, P bits of the binary codes can indicate values beyond the third predetermined value range, P is larger than O.

5. The method according to claim 4, wherein the first predetermined value range is ranged from 1 to 63, the second predetermined value range is ranged from 64 to 255, the third predetermined value range is ranged from 256 to 2047, and the fourth predetermined value range is greater than 2047.

6. The method according to claim 4, wherein adding a corresponding predetermined prefix value before the suffix values to obtain the corresponding coding data of the non-zero absolute value according to the predetermined value ranges, comprises:
    when the absolute value is within the first predetermined value range, setting a first predetermined binary codes as the prefix value before the corresponding suffix value;
    when the absolute value is within a second predetermined value range, setting a second predetermined binary codes as the prefix value before the corresponding suffix value, the second predetermined value, bits of the second predetermined binary codes is larger than that of the first predetermined binary codes;
    when the absolute value is within the third predetermined value range, setting a third predetermined binary codes as the prefix value before the corresponding suffix value, bits of the third predetermined binary codes is larger than that of the second predetermined binary codes; and
    when the absolute value is within the forth predetermined value range, setting a fourth binary codes as the prefix value before the corresponding suffix value, bits of the second predetermined binary codes is larger than that of the third predetermined binary codes.

7. The method according to claim 1, wherein the integer data includes a plurality of integer values in order, performing difference processing on the integer flow data to obtain difference data comprises:

calculating the second-order difference of the integer values to obtain the difference values.

8. The method according to claim 7, wherein the calculate the second-order difference of the integer values to obtain the difference values further comprises:
calculating the second-order difference of the integer values beginning a third integer value of the integer data.

9. The method according to claim 1, wherein performing integer processing on original flow data to obtain integer flow data comprises:
obtaining desired precision information, the desired precision information includes decimal places; and
enlarging each value in the original flow data by a corresponding multiple to obtain corresponding integer values according to the decimal places.

10. The method according to claim 1, wherein the corresponding multiple is equal to the quantity of the decimal places.

11. A computer equipment, wherein the computer equipment comprises:
a memory, configured store program instructions; and
a processor, configured to execute the program instructions to perform a method for dealing with respiratory flow data, the method comprises:
performing integer processing on original flow data to obtain integer flow data;
performing difference processing on the integer flow data to obtain difference flow data, the difference flow data having a plurality of difference values in order, the difference values having zero values, positive values, and negative values;
if previous one difference value of the zero difference value or one positive difference value is negative, adding a marker value before the difference value that is zero or positive; when previous one difference value of the negative difference value is zero or positive, adding the marker value before the difference value that is negative;
performing absolute value processing on the difference flow values to obtain the absolute values; and
encoding the absolute values and the marker values to obtain encode flow data.

12. The system according to claim 11, wherein encoding the absolute values and the marker values to obtain encode flow data comprises:
setting value of code data for each zero absolute value to zero;
setting value of code data for each marker value to a predetermined value; and
encoding non-zero absolute values to obtain the corresponding coding data according to a predetermined encoding rules.

13. The system according to claim 12, wherein encoding non-zero absolute values to obtain the corresponding coding data according to a predetermined encoding rules comprises:
converting each non-zero absolute value to binary codes;
selecting code values from the binary codes as suffix values according to predetermined value ranges; and
adding a corresponding predetermined prefix value before the suffix values to obtain the corresponding coding data of the non-zero absolute value according to the predetermined value ranges.

14. The system according to claim 13, wherein the predetermined value ranges includes a first predetermined value range, a second predetermined value range, a third predetermined value range, and a fourth predetermined value range, selecting the code values from the binary codes as the suffix values according to the predetermined value ranges comprises:
when the absolute value is within the first predetermined value range, selecting the last N bits of the binary codes as the suffix values, N bits of the binary codes can indicate all values contained in the first predetermined value range;
when the absolute value is within a second predetermined value range, select the last M bits of the binary codes as the suffix values, M bits of the binary codes can indicate all values contained in the second predetermined value range, M is larger than the N;
when the absolute value is within the third predetermined value range, selecting the last O bits of the binary codes as the suffix values, O bits of the binary codes can indicate all values contained in the third predetermined value range, O is larger than M; and
when the absolute value is within the fourth predetermined value range, selecting the last P bits of the binary codes as the suffix values, P bits of the binary codes can indicate values beyond the third predetermined value range, P is larger than O.

15. The system according to claim 14, wherein the first predetermined value range is ranged from 1 to 63, the second predetermined value range is ranged from 64 to 255, the third predetermined value range is ranged from 256 to 2047, and the fourth predetermined value range is greater than 2047.

16. The system according to claim 14, wherein adding a corresponding predetermined prefix value before the suffix values to obtain the corresponding coding data of the non-zero absolute value according to the predetermined value ranges, comprises:
when the absolute value is within the first predetermined value range, setting a first predetermined binary codes as the prefix value before the corresponding suffix value;
when the absolute value is within a second predetermined value range, setting a second predetermined binary codes as the prefix value before the corresponding suffix value, the second predetermined value, bits of the second predetermined binary codes is larger than that of the first predetermined binary codes;
when the absolute value is within the third predetermined value range, setting a third predetermined binary codes as the prefix value before the corresponding suffix value, bits of the third predetermined binary codes is larger than that of the second predetermined binary codes; and
when the absolute value is within the forth predetermined value range, setting a fourth binary codes as the prefix value before the corresponding suffix value, bits of the second predetermined binary codes is larger than that of the third predetermined binary codes.

17. The system according to claim 11, wherein the integer data includes a plurality of integer values in order, performing difference processing on the integer flow data to obtain difference data comprises:
calculating the second-order difference of the integer values to obtain the difference values.

18. The system according to claim 17, wherein the calculate the second-order difference of the integer values to obtain the difference values further comprises:
calculating the second-order difference of the integer values beginning a third integer value of the integer data.

19. The system according to claim 11, wherein performing integer processing on original flow data to obtain integer flow data comprises:
  get desired precision information, the desired precision information includes decimal places; and
  enlarging each value in the original flow data by a corresponding multiple to obtain corresponding integer values according to the decimal places, the corresponding multiple is equal to the quantity of the decimal places.

20. The system according to claim 19, wherein the corresponding multiple is equal to the quantity of the decimal places.

* * * * *